US005208513A

United States Patent [19]

Murayama

[11] Patent Number: 5,208,513

[45] Date of Patent: May 4, 1993

[54] MONITORING CIRCUIT FOR A LIGHT EMISSION DEVICE

[75] Inventor: Kazuo Murayama, Yokohama, Japan

[73] Assignee: Sumitomo Electric Industries, Ltd., Osaka, Japan

[21] Appl. No.: 735,261

[22] Filed: Jul. 24, 1991

[51] Int. Cl.[5] ........................ H01J 1/60; G05F 1/00; G08B 21/00; G01R 1/30

[52] U.S. Cl. ........................ 315/129; 315/291; 315/307; 340/664; 324/123 R

[58] Field of Search ........................ 307/310, 350, 494; 324/74, 123 R, 126, 132; 340/660, 664, 811; 372/38; 315/129, 134, 135, 307, 291

[56] References Cited

U.S. PATENT DOCUMENTS

| | | | |
|---|---|---|---|
| 3,566,266 | 2/1971 | Bloom | 324/123 R |
| 3,705,316 | 12/1972 | Burrous et al. | 307/310 |
| 3,781,693 | 12/1973 | Ford | 307/310 |
| 4,292,606 | 9/1981 | Trimmel | 372/38 |
| 4,374,359 | 2/1983 | Missout | 324/126 |
| 4,572,987 | 2/1986 | Embrey et al. | 315/135 |
| 4,763,334 | 8/1988 | Shimada et al. | 372/38 |
| 4,792,701 | 12/1988 | Olon et al. | 315/135 |

FOREIGN PATENT DOCUMENTS

| | | | |
|---|---|---|---|
| 2-280083 | 9/1990 | Japan | 315/135 |

*Primary Examiner*—Robert J. Pascal
*Assistant Examiner*—Michael B. Shingleton
*Attorney, Agent, or Firm*—Cushman, Darby & Cushman

[57] ABSTRACT

There is disclosed a monitoring circuit for a light emission device comprising; conversion circuit for converting a current flowing through a light emission device when a drive signal is applied thereto a voltage; shift adjustment circuit for producing shift adjustment signal of a variable output level; and a feedback type amplification unit for amplifying the output voltage of the conversion circuit to produce a monitor signal; wherein amplification unit includes gain control circuit for controlling gain of said amplification unit; the shift adjustment signal is supplied to a feedback loop of the amplification unit.

7 Claims, 2 Drawing Sheets

MONITORING CIRCUIT FOR A LIGHT EMISSION DEVICE

BACKGROUND OF THE INVENTION

1. Field of the Invention

The present invention relates to a monitoring circuit for a light emission device such as a laser diode.

2. Related Background Art

It has been known to use an optical-power meter to monitor an optical-output in order to maintain and inspect a laser diode. The optical-powermeter usually comprises a photo-sensing device such as a photo-diode. An optical-output of the laser diode is converted to an optical-current by the photo-diode, and the optical-output is monitored based on the optical-current.

However, the optical-powermeter is not provided in an actually operated optical communication system and it should be connected wherever the measurement is required, and furthermore the operation of the system, it is not possible to monitor the optical-output of the laser diode. Accordingly, a technique for monitoring in a simple way has been designed. Particularly in a transmission service of a multi-channel video signal and a CATV system which offers a bilateral data communication service, many optical transmitters are used and hence many laser diodes are necessarily used. Accordingly, a technique which permits the monitoring during the operation of the system is required.

SUMMARY OF THE INVENTION

It is an object of the present invention to provide a monitoring circuit for a laser diode which permits to monitor the optical-output during the operation of a system and permits the monitoring of the optical-output in a simple way.

The monitoring circuit according to the present invention comprises;

conversion means for converting a current flowing through a light emission device into a voltage when a drive signal is applied; shift adjustment means for producing a shift adjustment signal of a variable output level; and a feedback type amplification means for amplifying an output voltage of the conversion means to produce a monitor signal; the amplification means including gain control means for controlling a gain of said amplification means; the shift adjustment signal being supplied to a feedback loop of said amplification means.

The present invention will become more fully understood from the detailed description given herinbelow and the accompanying drawings which are given for the purpose of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Figure 1:
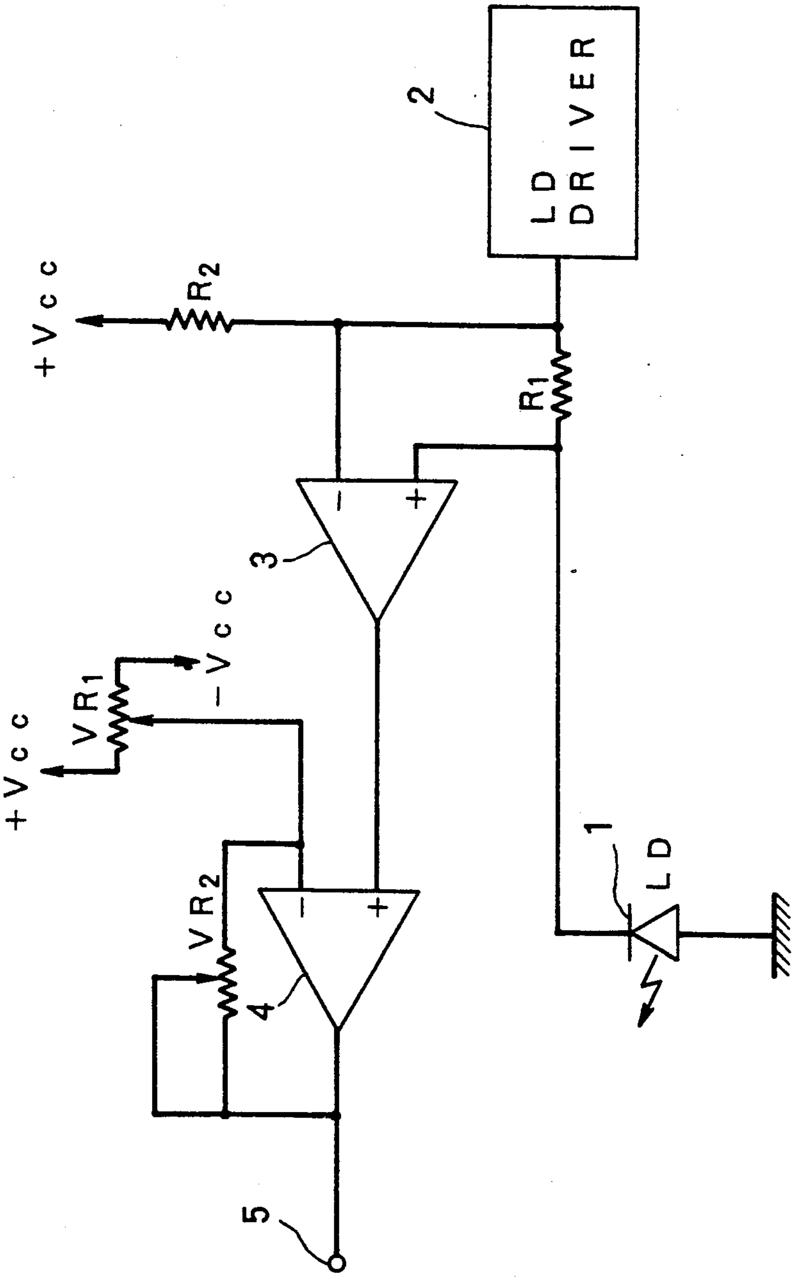
FIG. 1 shows a configuration of one embodiment of a monitoring circuit of the present invention.

A circuit shown in FIG. 1 may be used as a part of an optical transmitter, in a VSB-AM (Vestigial Side Band-Amplitude Modulation) optical transmitter. In this circuit, a laser diode (LD) 1 emits a light when a drive signal is applied by an LD driver 2 on an anode side. A resistor R1 is connected between an anode of the laser diode 1 and the LD driver 2. A voltage developed across the resistor R1 is amplified by an operational amplifier (OP-AMP) 3 and the amplified voltage is applied to a non-inverting input terminal (+) of an OP-AMP 4 which forms feedback type amplification means. The resistors R1 and R2 also have a function to supply a bias voltage to the laser diode 1. A voltage determined by a source voltage +Vcc and the resistor R2 is applied to an inverting input terminal (−) of the OP-AMP 3 which forms current-voltage conversion means, in order to adjust an output voltage.

A voltage determined by +VCC and −VCC which are divided by a potentiometer VR1 which is a part of level adjustment signal output means is applied to an inverting input terminal (−) of the OP-AMP 4. The OP-AMP 4 amplifies a detection voltage of the resistor R1 applied to a non-inverting input terminal (+) thereof. A potentiometer VR1 is connected between an output terminal and the inverting input terminal (−) of the OP-AMP 4. The potentiometer VR2 forms gain control means for contolling a gain by changing the resistance of the potentiometer VR2. The final output of the OP-AMP4 is produced at the output terminal 5, which can be connected to a voltmeter such as a tester, or the output may be supplied to an alarm device which compares it with a predetermined reference to issue an alarm, or means for adjusting the bias current of the laser diode 1.

In the monitoring circuit for the laser diode of the present embodiment, since the optical-output of the laser diode is proportional to the drive current flowing through the laser diode 1, the optical-output of the laser diode 1 is proportional to the voltage produced at the output terminal 5.

Figure 2:
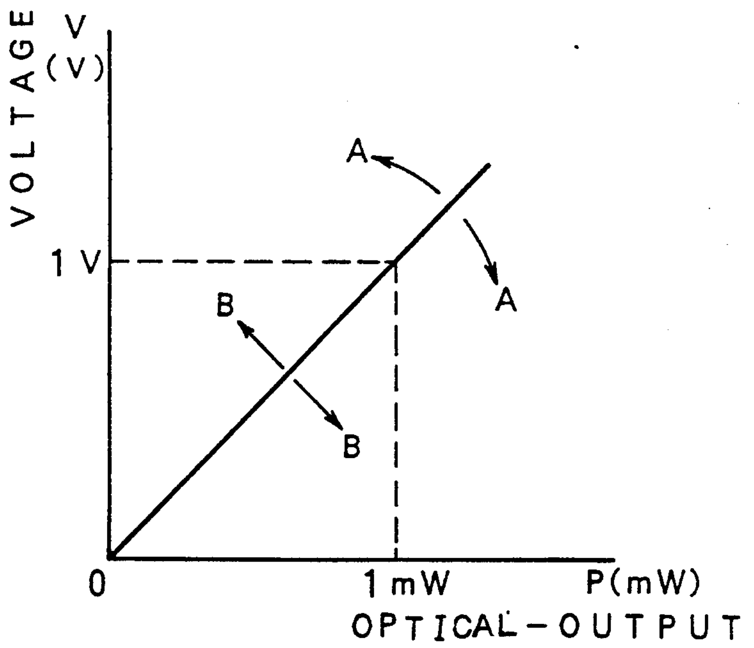
FIG. 2 shows an output characteristic attained in the embodiment of FIG. 1.

Further, by changing the gain of the amplification means (OP-AMP) 4 by the potentiometer VR2, a gain curve which is a characteristic curve showing the relation between the voltage at the output terminal 5 and the optical-output of the laser diode 1 inclines along an arrow A—A shown in FIG. 2. Further, by changing the shift adjustment signal (the voltage divided by the potentiometer VR2) applied to the feedback circuit of the OP-AMP 4, the characteristic curve is shifted along an arrow B—B in FIG. 2 to form a new characteristic curve which is parallel to the original characteristic curve.

Accordingly, by externally controlling the VR1 which is the shift adjustment signal output means and the VR2 which is the gain control means by an operator, the optical-output of the laser diode 1 may be monitored with a simple relation such as 1 volt versus 1 mW (FIG. 2).

The following describes this in more detail. In the present monitoring circuit, the output status of the laser diode 1 for 1 mW and 0 mW are created while the optical-output power of the laser diode 1 is measured by an optical-powermeter (not shown). A voltmeter (not shown) such as a tester is connected to the output terminal 5, and the voltage at the output terminal 5 is set to 0 volt by the potentiometer VR1 when the optical-output power is 10 mW, and the voltage at the output terminal 5 is set to 1 volt by the potentiometer VR2 when the optical-output power is 1 mW. After such adjustment, the voltmeter is connected to the output terminal 5 to read the voltage while the laser diode 1 is operated in the actual optical communication system. Thus the read voltage corresponds to the optical-output in mW of the laser diode 1.

As shown in the output characteristic chart of FIG. 2, the potentiometer VR1 is manipulated to shift the output characteristic at the output terminal 5 along the arrow B—B, and the potentiometer VR2 is manipulated to adjust the gradient of the output characteristic along the arrow A—A. Thus, the optical-output of the laser diode 1 can be monitored in the simple way. Most preferably, 1 volt of the voltmeter corresponds to 1 mV of the optical-output of the laser diode so that mere change of unit is needed, although relatively simple proportional relation such as 1 to 2 or 1 to 3 may be used.

The present invention is not limited to the above embodiment but various modifications thereof may be made. For example, the light emission device may be a light emission diode (LED). The shift adjustment signal output means may be one which change the voltage and applies the changed voltage to the inverting terminal of the OP-AMP 4 to increase or reduce the signal magnitude in the feedback loop. Accordingly, it may apply a variable current instead of the voltage to the inverting terminal. In accordance with the present invention, the optical-output of the laser diode is converted to the voltage, which is amplified, and the output voltage and the optical-output have the simple relationship by the gain control and the shift adjustment. Accordingly, the optical-output may be monitored based on the voltage in the simple way even if the laser diode is in operation.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A monitoring circuit for monitoring a light emission device, comprising:
   - conversion means for providing a voltage signal based upon current flowing through said light emission device;
   - means for amplifying said voltage signal of said conversion means to produce an amplified voltage;
   - level adjustment means for producing a shift adjustment signal of a variable output voltage level; and
   - feedback type amplification means for controlling further amplification of said amplified voltage by using a feedback loop and said shift adjustment signal to produce a monitor signal which has a linear relationship to the amount of light emitted by said light emission device.

2. A monitoring circuit according to claim 1, wherein said light emission device is a laser diode.

3. A monitoring circuit according to claim 1, wherein said conversion means includes a resistor through which said drive signal is conveyed and an amplifying voltage means for amplifying a voltage across said resistor.

4. A monitoring circuit according to claim 1, wherein said level adjustment means permits a change in a voltage level of the shift adjustment signal by an external manipulation such that the level of the monitor signal is zero when the level of the optical-output of said light emission device is zero.

5. A optical-output monitoring circuit according to claim 1, wherein said feedback loop has a gain control means for controlling the gain in amplification which is an externally controllable variable resistor.

6. A monitoring circuit according to claim 5, wherein said externally controllable variable resistor is a potentiometer.

7. A monitoring circuit for monitoring a light emission device, comprising:
   - conversion means for providing a voltage signal based upon current flowing through said light emission device;
   - shift adjustment means for producing a shift adjustment signal of a variable output voltage level; and
   - feedback type amplification means for amplifying said voltage signal of said conversion means to produce an output monitor signal which has a linear relationship to the amount of light emitted by said light emission device, whereby said shift adjustment signal is supplied to a feedback loop of said feedback type amplification means.

* * * * *